(12) United States Patent
Yu

(10) Patent No.: US 6,380,043 B1
(45) Date of Patent: Apr. 30, 2002

(54) LOW TEMPERATURE PROCESS TO FORM ELEVATED DRAIN AND SOURCE OF A FIELD EFFECT TRANSISTOR HAVING HIGH-K GATE DIELECTRIC

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/781,357

(22) Filed: Feb. 12, 2001

(51) Int. Cl.[7] .................................... H01L 21/336
(52) U.S. Cl. ............................... 438/305; 438/300
(58) Field of Search ................................ 438/305, 300, 438/303, 301, 299, 197

(56) References Cited

U.S. PATENT DOCUMENTS

| | | | | |
|---|---|---|---|---|
| 5,338,698 A | * | 8/1994 | Subbanna | 438/305 |
| 5,683,921 A | * | 11/1997 | Nishio et al. | 438/305 |
| 5,710,450 A | * | 1/1998 | Chau et al. | 257/344 |
| 6,198,142 B1 | * | 3/2001 | Chau et al. | 257/344 |
| 6,239,472 B1 | * | 5/2001 | Shenoy | 257/408 |
| 6,287,925 B1 | * | 9/2001 | Yu | 438/305 |

* cited by examiner

Primary Examiner—Michael Trinh

(74) Attorney, Agent, or Firm—Monica H. Choi

(57) ABSTRACT

For fabricating a field effect transistor, a gate structure is formed on a gate dielectric on an active device area of a semiconductor substrate. An amorphization dopant and an extension dopant are implanted into exposed regions of the active device area to form drain and source extension junctions extending down to an extension depth within the semiconductor substrate. First and second spacers are formed at sidewalls of the gate structure. Any exposed regions of the active device area of the semiconductor substrate are etched down beyond the extension depth. The drain and source extension junctions remain disposed under the first and second spacers. A layer of doped amorphous semiconductor material is deposited to cover the structures on the semiconductor substrate and is doped with a contact dopant in an in-situ deposition process using a temperature of less than about 500° Celsius. The amorphous semiconductor material is polished down until the top surfaces of the gate structure and the first and second spacers are level with a top surface of the amorphous semiconductor material. The amorphous semiconductor material remaining to the first sidewall of the gate structure forms an elevated drain contact structure, and the amorphous semiconductor material remaining to the second sidewall of the gate structure forms an elevated source contact structure. A thermal anneal is performed using a temperature less than about 600° Celsius to activate the dopants within the drain and source extension junctions and within the drain and source contact structures. Such low temperatures preserve the gate dielectric comprised of a high-K dielectric material.

12 Claims, 4 Drawing Sheets

LOW TEMPERATURE PROCESS TO FORM ELEVATED DRAIN AND SOURCE OF A FIELD EFFECT TRANSISTOR HAVING HIGH-K GATE DIELECTRIC

TECHNICAL FIELD

The present invention relates generally to fabrication of field effect transistors having scaled-down dimensions, and more particularly, to a process for forming elevated drain and source contact structures using relatively low temperatures to preserve the gate dielectric having a high dielectric constant for the field effect transistor having scaled down dimensions of tens of nanometers.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where the MOSFET 100 is fabricated therein.

The MOSFET 100 also includes a spacer 122 disposed on the sidewalls of the gate electrode 118 and the gate dielectric 116. When the spacer 122 is comprised of silicon nitride ($Si_3N_4$), then a spacer liner oxide 124 is deposited as a buffer layer between the spacer 122 and the sidewalls of the gate electrode 118 and the gate dielectric 116.

As the dimensions of the MOSFET 100 are further scaled down, the thickness of the gate dielectric 116 is also scaled down. However, with a thinner gate dielectric 116, more charge carriers tunnel through the thin gate dielectric 116 to result in undesired leakage current at the gate of the MOSFET 100, as known to one of ordinary skill in the art of integrated circuit fabrication. To minimize such undesired leakage current, a dielectric material having a dielectric constant that is higher than the dielectric constant of silicon dioxide ($SiO_2$) (i.e., a high-K dielectric material) is used for the gate dielectric 116, as known to one of ordinary skill in the art of integrated circuit fabrication. The gate dielectric 116 has a higher thickness when comprised of such a high-K dielectric material than when comprised of silicon dioxide ($SiO_2$) for the same drive current of the MOSFET 100 to minimize undesired tunneling current through the gate dielectric 116.

In addition, as the dimensions of the MOSFET 100 are further scaled down, the thickness of the drain and source silicides 110 and 114 is also scaled down as the depth of the drain and source contact junctions 108 and 112 is scaled down. However, thinner drain and source silicides 110 and 114 with the lower volume of silicide result in higher resistance at the drain and source of the MOSFET 100.

Referring to FIG. 2, to increase the volume of silicide, an elevated drain structure 132 is formed to be coupled to the drain extension junction 104, and an elevated source structure 134 is formed to be coupled to the source extension junction 106, as known to one of ordinary skill in the art of integrated circuit fabrication. Referring to FIG. 3, a drain silicide 142 is formed within the elevated drain structure 132, and a source silicide 144 is formed within the elevated source structure 134. Because the elevated drain and source structures 132 and 134 have higher thickness and are not limited to the depth of the drain and source contact junctions 108 and 112, thicker drain and source silicides 142 and 144 may be formed with the elevated drain and source structures 132 and 134 to minimize the resistance at the drain and source of the MOSFET 100.

In the prior art, the elevated drain and source structures 132 and 134 are comprised of silicon deposited by an epitaxy deposition process using a relatively high temperature in the range of from about 1100° Celsius to about 1200° Celsius. In addition, referring to FIG. 2, a contact dopant is implanted into the elevated drain and source structures 132 and 134 and activated in a thermal anneal process using a relatively high temperature in the range of from about 800° Celsius to about 1000° Celsius.

However, to minimize charge carrier tunneling through the gate dielectric 116, a high-K dielectric material having a dielectric constant that is higher than the dielectric constant of silicon dioxide ($SiO_2$) is used for the gate dielectric 116. When the semiconductor substrate 102 is comprised of silicon, such high-K dielectric material, such as metal oxide for example, may react with the silicon semiconductor substrate 102 at any temperature greater than about 750° Celsius to degrade the gate dielectric 116.

Nevertheless, elevated drain and source structures are desired for increasing the volume of the drain and source silicides while a gate dielectric comprised of a high-K dielectric material is also desired for minimizing charge carrier tunneling through the gate dielectric, as the dimensions of the MOSFET are further scaled down. Thus, a mechanism is desired for fabricating drain and source silicides with elevated drain and source contact structures using temperatures below about 750° Celsius to preserve the integrity of the gate dielectric comprised of a high-K dielectric material.

SUMMARY OF THE INVENTION

Accordingly, in a general aspect of the present invention, elevated drain and source contact structures are formed with deposition of an in-situ doped amorphous semiconductor material using a temperature of less than about 500° Celsius. In addition, an amorphization dopant is implanted into the drain and source extension junctions such that extension dopant within the drain and source extension junctions and contact dopant within the elevated drain and source contact structures are activated using a temperature of less than about 600° Celsius.

In one embodiment of the present invention, a field effect transistor is fabricated within an active device area of a semiconductor substrate. A gate structure is formed on a gate dielectric on the active device area of the semiconductor substrate, and the gate dielectric has a dielectric constant that is higher than the dielectric constant of silicon dioxide ($SiO_2$). An amorphization dopant and an extension dopant are implanted into exposed regions of the active device area of the semiconductor substrate.

A first spacer is formed at a first sidewall of the gate structure and the gate dielectric, and a second spacer is formed at a second sidewall of the gate structure and the gate dielectric. The first spacer is disposed over a drain extension junction extending down to an extension depth within the active device area of the semiconductor substrate and having the amorphization dopant and the extension dopant implanted therein. The second spacer is disposed over a source extension junction extending down to the extension depth within the active device area of the semiconductor substrate and having the amorphization dopant and the extension dopant implanted therein.

Any exposed regions of the active device area of the semiconductor substrate are etched down beyond the extension depth. The drain extension junction remains disposed under the first spacer, and the source extension junction remains disposed under the second spacer. A layer of amorphous semiconductor material is deposited to cover the first and second spacers and the gate structure and on any exposed regions of the semiconductor substrate. The layer of amorphous semiconductor material is formed to be doped with a contact dopant in an in-situ deposition process using a temperature less than about 500° Celsius.

The amorphous semiconductor material is polished down until top surfaces of the gate structure and the first and second spacers are exposed such that the top surfaces of the gate structure and the first and second spacers are level with a top surface of the amorphous semiconductor material. The amorphous semiconductor material remaining to the first sidewall of the gate structure forms an elevated drain contact structure, and the amorphous semiconductor material remaining to the second sidewall of the gate structure forms an elevated source contact structure. A thermal anneal is performed using a temperature less than about 600° Celsius to activate the extension dopant within the drain and source extension junctions and to activate the contact dopant within the drain and source contact structures.

In another aspect of the present invention, a drain silicide is formed within the drain contact structure, and a source silicide is formed within the source contact structure using a temperature in a range of from about 400° Celsius to about 500° Celsius. Such drain silicide and source silicide may be comprised of nickel silicide (NiSi) for example.

In this manner, temperatures less than about 600° Celsius are used for formation of the structures of the field effect transistor such as the drain and source extension junctions, the drain and source elevated contact structures, and the drain and source silicides. With such low temperatures, the gate dielectric comprised of a high-K dielectric material does not react with the semiconductor substrate to preserve the integrity of such a gate dielectric. In addition, thicker silicides may be formed with the elevated drain and source contact structures to minimize resistance at the drain and source of the field effect transistor.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, and 11 refer to elements having similar structure and function.

DETAILED DESCRIPTION

Figure 1:
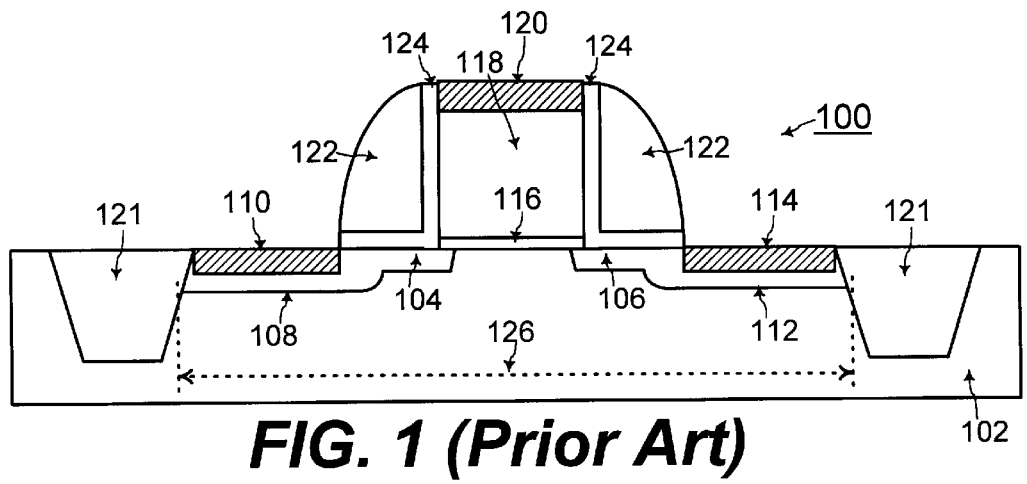
FIG. 1 shows a cross-sectional view of a conventional MOSFET (Metal Oxide Semiconductor Field Effect Transistor) without elevated drain and source contact structures.
Figure 2:
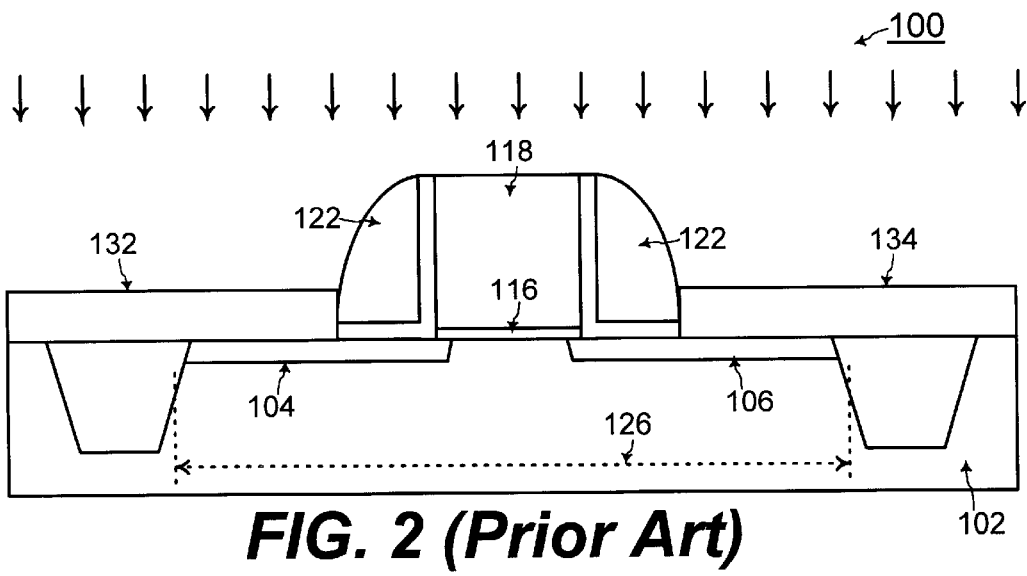
FIG. 2 shows a cross-sectional view of a conventional MOSFET (Metal Oxide Semiconductor Field Effect Transistor) with elevated drain and source contact structures formed with an epitaxy deposition process using relatively high temperatures, according to the prior art.
Figure 3:
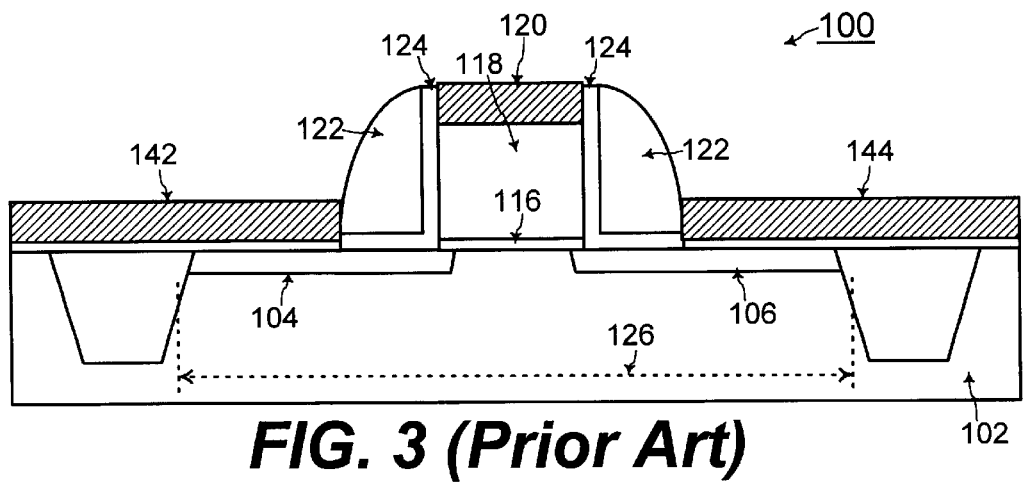
FIG. 3 shows a cross sectional view of drain and source silicides formed in the elevated drain and source contact structures of FIG. 2, according to the prior art.
Figure 4:
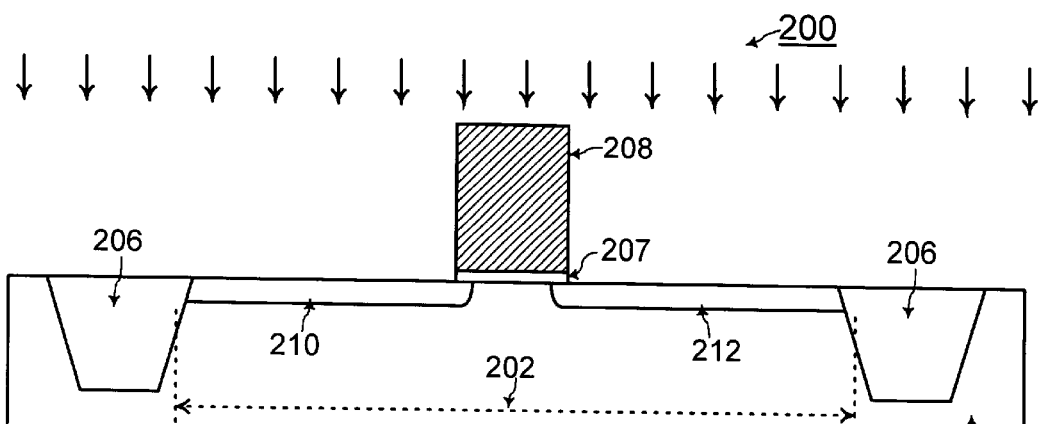
FIGS. 4, 5, 6, 7, 8, 9, 10, and 11 show cross-sectional views for illustrating the steps for fabricating a MOSFET (Metal Oxide Semiconductor Field Effect Transistor) with drain and source silicides formed within elevated drain and source contact structures using relatively low temperatures to prevent reaction of a gate dielectric comprised of a high-K dielectric material with the semiconductor substrate to preserve the integrity of such a gate dielectric, according to one embodiment of the present invention.

Referring to FIG. 4, a MOSFET (Metal Oxide Semiconductor Field Effect Transistor) 200 is fabricated within an active device area 202 of a semiconductor substrate 204 defined by shallow trench isolation structures 206. The semiconductor substrate 204 is comprised of silicon in one embodiment of the present invention. Processes for formation of shallow trench isolation structures for electrically isolating integrated circuit devices within a semiconductor substrate are known to one of ordinary skill in the art of integrated circuit fabrication.

A gate dielectric 207 and a gate structure 208 are formed on the active device area 202 of the semiconductor substrate 204. The gate dielectric 207 is comprised of a high-K dielectric material, such as a metal oxide for example, having a dielectric constant that is higher than the dielectric constant of silicon dioxide ($SiO_2$) for minimizing undesired tunneling current through the gate dielectric 207. The gate structure 208 is comprised of metal, such as copper or tungsten for example, in one embodiment of the present invention. Processes for formation of such gate dielectric 207 and gate structure 208 are known to one of ordinary skill in the art of integrated circuit fabrication.

A drain extension junction 210 and a source extension junction 212 are formed by implantation of an amorphization dopant into exposed regions of the active device area 202 of the semiconductor substrate 204. The drain and source extension junctions 210 and 212 extend down to an extension depth that is less than about 200 angstroms for the MOSFET 200 having scaled down dimensions of tens of nanometers. When the semiconductor substrate is comprised of silicon, the amorphization dopant is comprised of one of germanium (Ge), silicon (Si), antimony (Sb), or xenon (Xe). Processes for implanting such amorphization dopant are known to one of ordinary skill in the art of integrated circuit fabrication.

Figure 5:
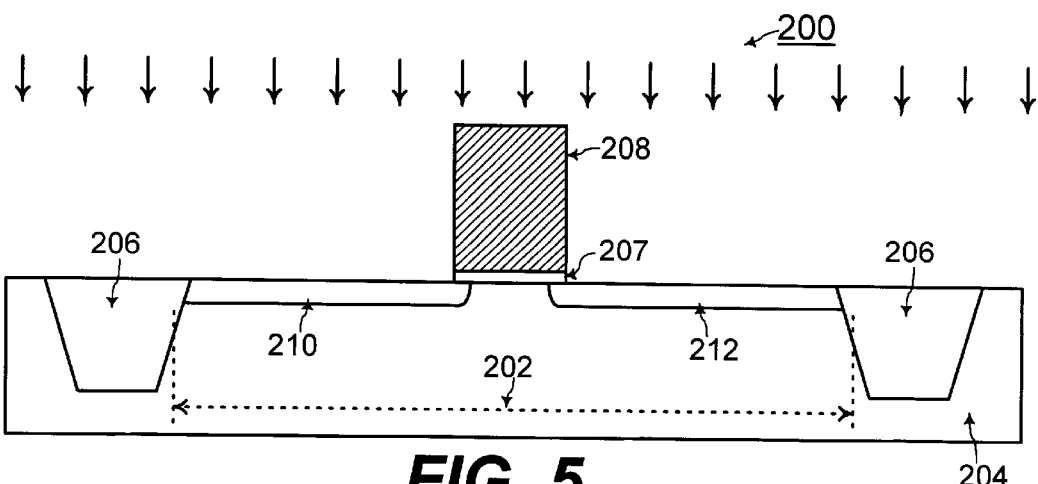

Referring to FIG. 5, an extension dopant is also implanted into the drain and source extension junctions 210 and 212. The parameters of the process for implanting the extension dopant are adjusted such that the extension dopant is implanted into the drain and source extension junctions 210 and 212 formed by the former implantation of the amorphization dopant in FIG. 4. The extension dopant is an N-type dopant for fabrication of an NMOSFET (N-channel Metal Oxide Semiconductor Field Effect Transistor) and is a P-type dopant for fabrication of a PMOSFET (P-channel Metal Oxide Semiconductor Field Effect Transistor). Such processes for implanting the extension dopant are known to one of ordinary skill in the art of integrated circuit fabrication.

The amorphization dopant implanted into the drain and source extension junctions 210 and 212 renders the semiconductor substrate to have an amorphous crystal structure within the drain and source extension junctions 210 and 212, as known to one of ordinary skill in the art of integrated circuit fabrication. A dopant within an amorphous semiconductor region may be activated at a lower temperature, as known to one of ordinary skill in the art of integrated circuit fabrication.

Figure 6:
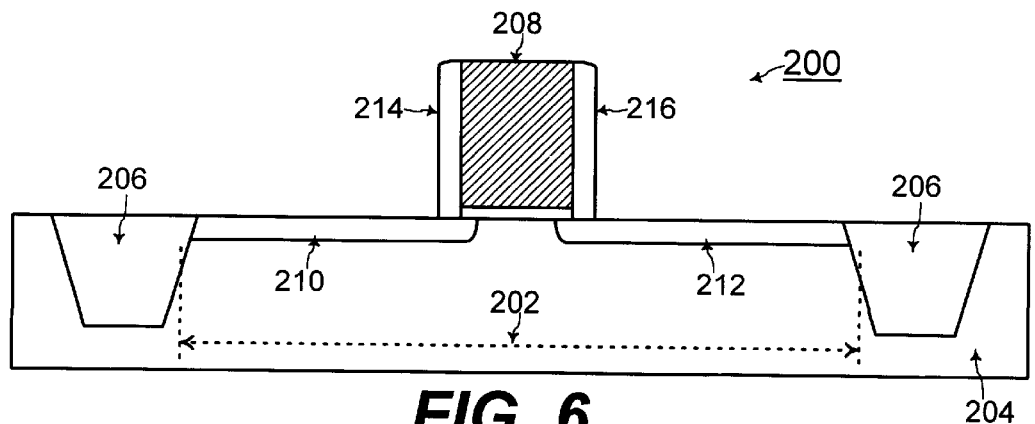

Referring to FIG. 6, a first spacer 214 is formed at a first sidewall of the gate structure 208 and the gate dielectric 207, and a second spacer 216 is formed at a second sidewall of the gate structure 208 and the gate dielectric 207. The first and second spacers 214 and 216 are comprised of silicon dioxide (SiO$_2$) having a width in a range of from about 50 angstroms to about 100 angstroms, according to one embodiment of the present invention. The first and second spacers 214 and 216 are formed in an oxide deposition process using a temperature of less than about 400° Celsius. Such a low temperature for formation of the first and second spacers 214 and 216 avoids recrystallization of the amorphous silicon regions and activation of the extension dopant within the drain and source extension junctions 210 and 212. Such oxide deposition processes are known to one of ordinary skill in the art of integrated circuit fabrication.

Figure 7:
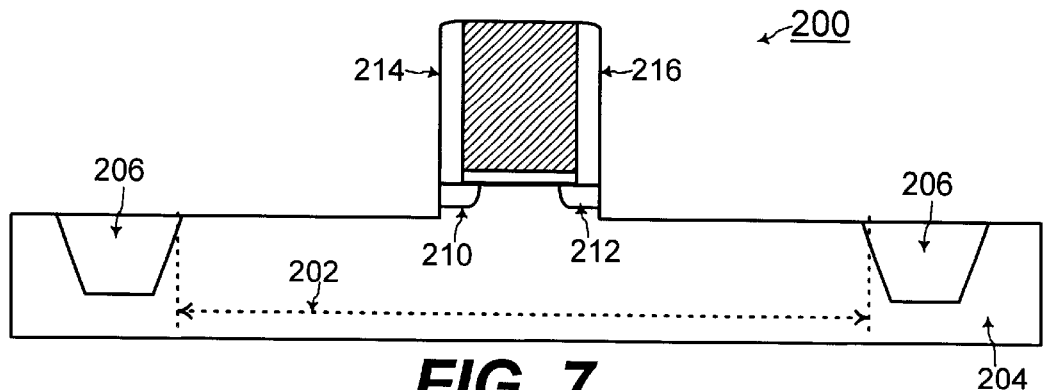

Referring to FIG. 7, any exposed region of the active device area 202 of the semiconductor substrate 204 is etched down beyond the extension depth of the drain and source extension junctions 210 and 212. For example, when the extension depth of the drain and source extension junctions 210 and 212 is less than about 200 angstroms, any exposed region of the active device area 202 of the semiconductor substrate 204 is etched down by between about 200 angstroms to about 400 angstroms, according to one embodiment of the present invention. Processes, such as an anisotropic plasma etching process, for etching down the exposed regions of the semiconductor substrate 204 are known to one of ordinary skill in the art of integrated circuit fabrication.

Figure 8:
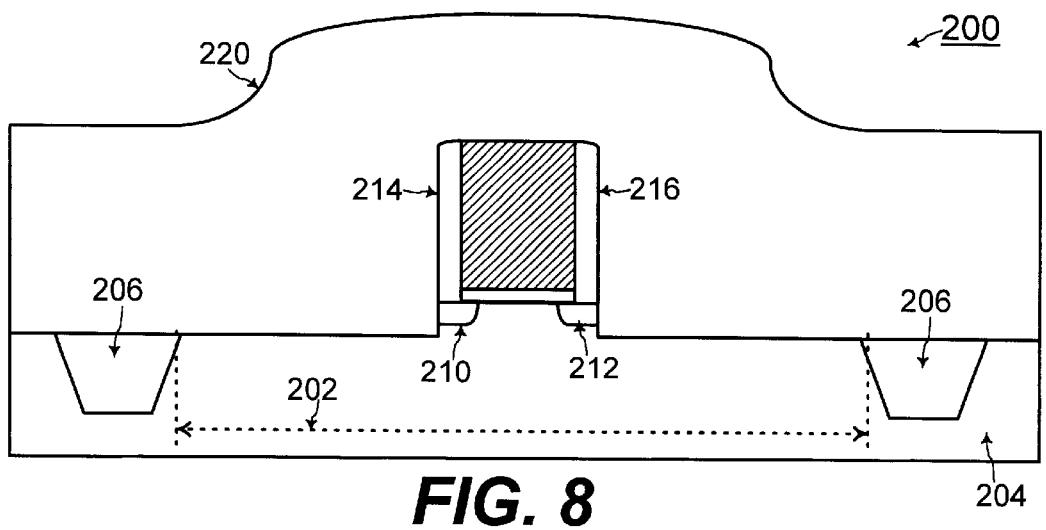

After etching down the exposed regions of the active device area 202 of the semiconductor substrate in FIG. 7, the drain extension junction 210 remains under the first spacer 214, and the source extension junction 212 remains under the second spacer 216. Referring to FIG. 8, a layer of amorphous semiconductor material 220 is blanket deposited to cover the first and second spacers 214 and 216 and the gate structure 208.

In one embodiment of the present invention, the layer of semiconductor material 220 is comprised of amorphous silicon having a relatively high thickness of from about 2000 Å (angstroms) to about 5000 Å (angstroms). Such a layer of semiconductor material 220 having the relatively high thickness extends above the top surfaces of the first and second spacers 214 and 216 and the gate structure 208. According to an embodiment of the present invention, the amorphous silicon 220 is doped with a contact dopant in an in-situ doped amorphous silicon deposition process using a temperature less than about 500° Celsius. The contact dopant is an N-type dopant for fabrication of an NMOSFET (N-channel Metal Oxide Semiconductor Field Effect Transistor) and is a P-type dopant for fabrication of a PMOSFET (P-channel Metal Oxide Semiconductor Field Effect Transistor).

Chemical vapor deposition processes for forming the layer of in-situ doped amorphous silicon 220 are known to one of ordinary skill in the art of integrated circuit fabrication. The relatively low temperature of less than about 500° Celsius used for deposition of the layer of amorphous silicon 220 avoids recrystallization of the amorphous silicon regions and activation of the extension dopant within the drain and source extension junctions 210 and 212 and the contact dopant within the layer of amorphous silicon 220.

Figure 9:
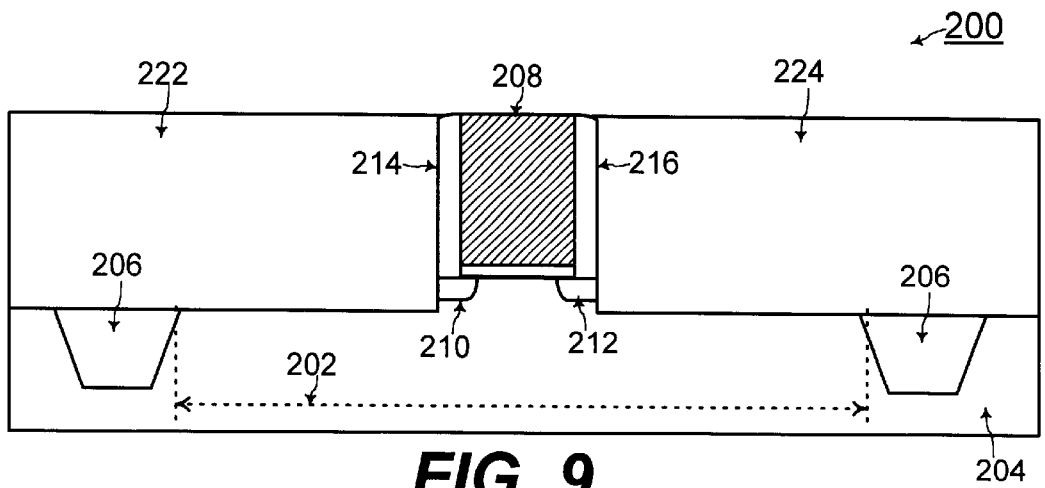

Referring to FIG. 9, the layer of semiconductor material 220 is polished down until the first and second spacers 214 and 216 and the gate structure 208 are exposed. Thus, the top surfaces of the first and second spacers 214 and 216 and the gate structure 208 are level with the top surfaces of the layer of semiconductor material 220. Processes, such as CMP (chemical mechanical polishing) processes, for polishing down the layer of semiconductor material 220 are known to one of ordinary skill in the art of integrated circuit fabrication.

Further referring to FIG. 9, the amorphous silicon material 220 remaining to the first sidewall of the gate structure 208 forms an elevated drain structure 222, and the amorphous silicon material 220 remaining to the second sidewall of the gate structure 222 forms an elevated source structure 224. Because the semiconductor substrate 204 has been etched down as illustrated in FIG. 7, the drain extension junction 210 contacts the drain contact structure 222, and the source extension junction 212 contact the source contact structure 224.

Figure 10:
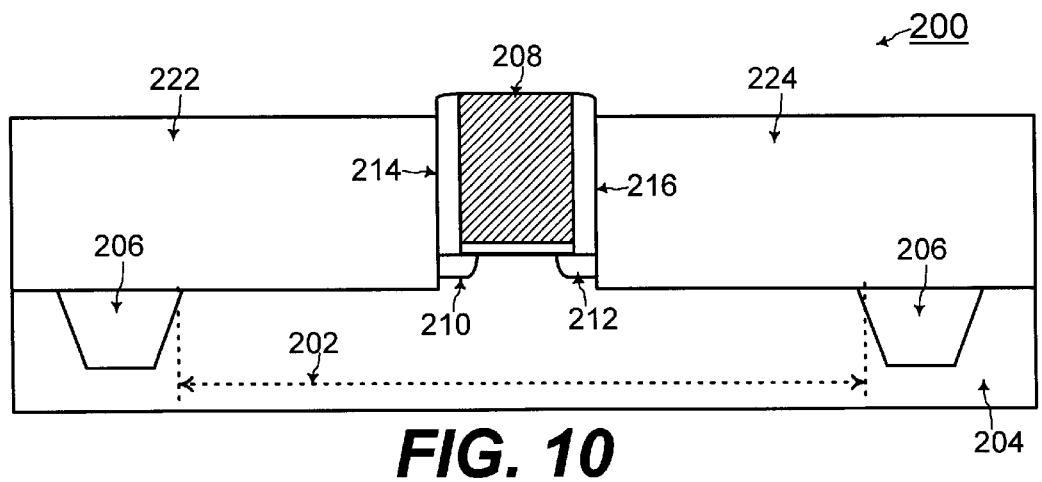

Referring to FIG. 10, the drain contact structure 222 and the source contact structure 224 are etched down by between about 300 angstroms to about 500 angstroms after the CMP (chemical mechanical polishing) process of FIG. 9. With such an etch, the top surfaces of the drain contact structure 222 and the source contact structure 224 are below the top surface of the gate structure 208. Such lower top surfaces of the drain contact structure 222 and the source contact structure 224 ensure that silicides formed from the top surfaces of the drain contact structure 222 and the source contact structure 224 do not undesirably bridge with the metal gate structure 208. Processes, such as an anisotropic plasma etching process, for etching down the drain contact structure 222 and the source contact structure 224 are known to one of ordinary skill in the art of integrated circuit fabrication.

Further referring to FIG. 10, a thermal anneal using a relatively low temperature in a range of from about 500°

Celsius to about 600° Celsius is performed to activate the extension dopant within the drain and source extension junctions 210 and 212 and to activate the contact dopant within the drain and source contact structures 222 and 224. Such a low temperature may be used to activate the extension dopant within the drain and source extension junctions 210 and 212 because the drain and source extension junctions 210 and 212 have been rendered to be amorphous silicon regions with implantation of the amorphization dopant. In addition, such a low temperature may be used to activate the contact dopant within the drain and source contact structures 222 and 224 because the drain and source contact structures are comprised of in-situ doped amorphous silicon. Thermal anneal processes are known to one of ordinary skill in the art of integrated circuit fabrication. The gate structure 208 is comprised of metal in one embodiment of the present invention such that a dopant is not activated within the gate structure 208 in a thermal anneal process.

Figure 11:
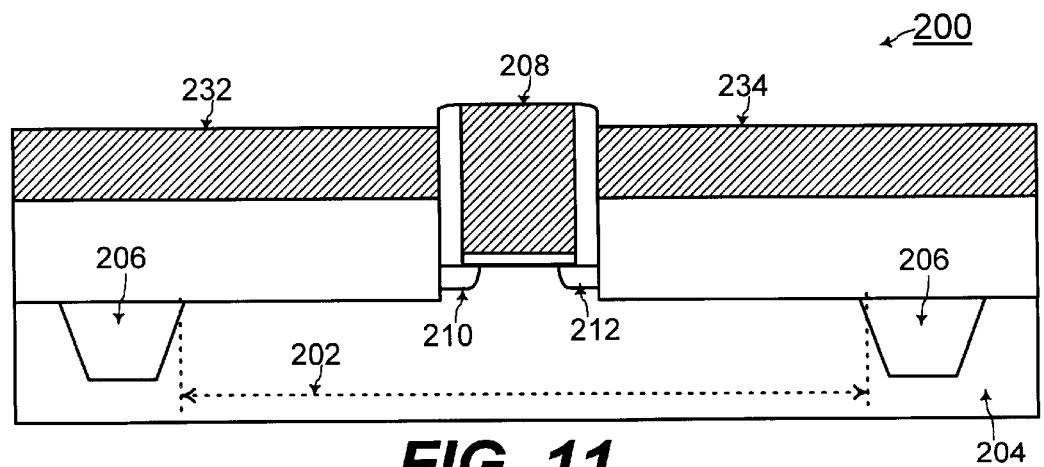

Referring to FIG. 11, a drain silicide 232 is formed with the elevated drain contact structure 222, and a source silicide 234 is formed with the elevated source contact structure 224. Preferably, a silicidation process using a relatively low temperature in a range of from about 400° Celsius to about 500° Celsius forms the drain and source silicides 232 and 234 which may be comprised of nickel silicide (NiSi) in one embodiment of the present invention. Such silicidation processes are known to one of ordinary skill in the art of integrated circuit fabrication.

In this manner, temperatures less than about 600° Celsius are used for formation of the structures of the MOSFET 200 such as the drain and source extension junctions 210 and 212, the drain and source elevated contact structures 222 and 224, and the drain and source silicides 232 and 234. With such low temperatures, the gate dielectric 207 comprised of a high-K dielectric material does not react with the semiconductor substrate 204 to preserve the integrity of such a gate dielectric 207. In addition, thicker drain and source silicides 232 and 234 may be formed with the elevated drain and source contact structures 222 and 224 to minimize resistance at the drain and source of the MOSFET 200.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "top," "side," and "on" as used herein refer to relative location and orientation of various portions of the structures with respect to one another, and are not intended to suggest that any particular absolute orientation with respect to external objects is necessary or required. The present invention is limited only as defined in the following claims and equivalents thereof.

I claim:

1. A method for fabricating a field effect transistor within an active device area of a semiconductor substrate, the method including the steps of:

A. forming a gate structure on a gate dielectric on said active device area of said semiconductor substrate, wherein said gate dielectric has a dielectric constant that is higher than the dielectric constant of silicon dioxide ($SiO_2$);

B. implanting an amorphization dopant and an extension dopant into exposed regions of said active device area of said semiconductor substrate;

C. forming a first spacer at a first sidewall of said gate structure and said gate dielectric, and forming a second spacer at a second sidewall of said gate structure and said gate dielectric;

wherein said first spacer is disposed over a drain extension junction extending down to an extension depth within said active device area of said semiconductor substrate and having said amorphization dopant and said extension dopant implanted therein;

and wherein said second spacer is disposed over a source extension junction extending down to said extension depth within said active device area of said semiconductor substrate and having said amorphization dopant and said extension dopant implanted therein;

D. etching down any exposed regions of said active device area of said semiconductor substrate beyond said extension depth;

wherein said drain extension junction remains disposed under said first spacer;

and wherein said source extension junction remains disposed under said second spacer;

E. depositing a layer of amorphous semiconductor material to cover said first and second spacers and said gate structure and on any exposed regions of said semiconductor substrate;

wherein said layer of amorphous semiconductor material is formed to be doped with a contact dopant in an in-situ deposition process using a temperature of less than about 500° Celsius;

F. polishing down said amorphous semiconductor material until top surfaces of said gate structure and said first and second spacers are exposed such that said top surfaces of said gate structure and said first and second spacers are level with a top surface of said amorphous semiconductor material;

wherein said amorphous semiconductor material remaining to said first sidewall of said gate structure forms an elevated drain contact structure;

and wherein said amorphous semiconductor material remaining to said second sidewall of said gate structure forms an elevated source contact structure; and G. performing a thermal anneal using a temperature less than about 600° Celsius to activate said extension dopant within said drain and source extension junctions and to activate said contact dopant within said drain and source contact structures.

2. The method of claim 1, wherein said amorphization dopant is comprised of one of germanium(Ge), silicon (Si), antimony (Sb), or xenon (Xe).

3. The method of claim 1, wherein said first and second spacers are comprised of silicon dioxide ($SiO_2$) having a width in a range of from about 50 angstroms to about 100 angstroms, and wherein said silicon dioxide ($SiO_2$) of said first and second spacers are formed in an oxide deposition process using a temperature of less than about 400° Celsius.

4. The method of claim 1, wherein said extension depth is less than about 200 angstroms, and wherein exposed regions of said active device area of said semiconductor substrate are etched down by between about 200 angstroms to about 400 angstroms in said step D.

5. The method of claim 1, wherein said layer of amorphous semiconductor material is comprised of amorphous silicon having a thickness in a range of from about 2000 angstroms to about 5000 angstroms.

6. The method of claim 1, further including the step of:

etching down said drain and source contact structures by between about 300 angstroms to about 500 angstroms after said step F.

7. The method of claim 1, further including the step of:

forming a drain silicide within said drain contact structure and forming a source silicide within said source contact structure using a temperature in a range of from about 400° Celsius to about 500° Celsius after said step G.

8. The method of claim 7, wherein said drain and source silicide are comprised of nickel silicide (NiSi).

9. The method of claim 1, wherein said extension dopant and said contact dopant are an N-type dopant for fabrication of an NMOSFET (N-channel Metal Oxide Semiconductor Field Effect Transistor).

10. The method of claim 1, wherein said extension dopant and said contact dopant are a P-type dopant for fabrication of a PMOSFET (P-channel Metal Oxide Semiconductor Field Effect Transistor).

11. The method of claim 1, wherein said gate structure is comprised of metal, and wherein said gate dielectric is comprised of a metal oxide.

12. A method for fabricating a MOSFET (metal oxide semiconductor field effect transistor) within an active device area of a semiconductor substrate, the method including the sequential steps of:

A. forming a gate structure comprised of metal on a gate dielectric comprised of a metal oxide on said active device area of said semiconductor substrate, wherein said gate dielectric has a dielectric constant that is higher than the dielectric constant of silicon dioxide ($SiO_2$);

B. implanting an amorphization dopant and an extension dopant into exposed regions of said active device area of said semiconductor substrate;

wherein said amorphization dopant is comprised of one of germanium(Ge), silicon (Si), antimony (Sb), or xenon (Xe);

C. forming a first spacer at a first sidewall of said gate structure and said gate dielectric, and forming a second spacer at a second sidewall of said gate structure and said gate dielectric;

wherein said first spacer is disposed over a drain extension junction extending down to an extension depth within said active device area of said semiconductor substrate and having said amorphization dopant and said extension dopant implanted therein;

wherein said second spacer is disposed over a source extension junction extending down to said extension depth within said active device area of said semiconductor substrate and having said amorphization dopant and said extension dopant implanted therein;

and wherein said first and second spacers are comprised of silicon dioxide ($SiO_2$) having a width in a range of from about 50 angstroms to about 100 angstroms, and wherein said silicon dioxide ($SiO_2$) of said first and second spacers are formed in an oxide deposition process using a temperature of less than about 400° Celsius;

D. etching down any exposed regions of said active device area of said semiconductor substrate beyond said extension depth;

wherein said drain extension junction remains disposed under said first spacer;

wherein said source extension junction remains disposed under said second spacer;

and wherein said extension depth is less than about 200 angstroms, and wherein exposed regions of said active device area of said semiconductor substrate are etched down by between about 200 angstroms to about 400 angstroms;

E. depositing a layer of amorphous semiconductor material to cover said first and second spacers and said gate structure and on any exposed regions of said semiconductor substrate;

wherein said layer of amorphous semiconductor material is formed to be doped with a contact dopant in an in-situ deposition process using a temperature of less than about 500° Celsius;

and wherein said layer of amorphous semiconductor material is comprised of amorphous silicon having a thickness in a range of from about 2000 angstroms to about 5000 angstroms;

F. polishing down said amorphous semiconductor material until top surfaces of said gate structure and said first and second spacers are exposed such that said top surfaces of said gate structure and said first and second spacers are level with a top surface of said amorphous semiconductor material;

wherein said amorphous semiconductor material remaining to said first sidewall of said gate structure forms an elevated drain contact structure;

and wherein said amorphous semiconductor material remaining to said second sidewall of said gate structure forms an elevated source contact structure;

G. etching down said drain and source contact structures by between about 300 angstroms to about 500 angstroms;

H. performing a thermal anneal using a temperature in a range of from about 500° Celsius to about 600° Celsius to activate said extension dopant within said drain and source extension junctions and to activate said contact dopant within said drain and source contact structures; and I. forming a drain silicide within said drain contact structure and forming a source silicide within said source contact structure using a temperature in a range of from about 400° Celsius to about 500° Celsius;

wherein said drain and source silicide are comprised of nickel silicide (NiSi);

wherein said extension dopant and said contact dopant are an N-type dopant for fabrication of an NMOSFET (N-channel Metal Oxide Semiconductor Field Effect Transistor);

and wherein said extension dopant and said contact dopant are a P-type dopant for fabrication of a PMOSFET (P-channel Metal Oxide Semiconductor Field Effect Transistor).

* * * * *